United States Patent [19]
Ahne et al.

[11] Patent Number: 4,883,730
[45] Date of Patent: Nov. 28, 1989

[54] METHOD FOR MANUFACTURING HEAT-STABLE STRUCTURED LAYERS BASED ON EXPOXY RESIN

[75] Inventors: Hellmut Ahne, Röttenbach; Winfried Plundrich, Nürnberg, both of Fed. Rep. of Germany

[73] Assignee: Siemens Aktiengesellschaft, Munich, Fed. Rep. of Germany

[21] Appl. No.: 336,578

[22] Filed: Apr. 11, 1989

Related U.S. Application Data

[63] Continuation of Ser. No. 092,473, Sep. 3, 1987, abandoned.

[30] Foreign Application Priority Data

Sep. 11, 1986 [DE] Fed. Rep. of Germany ....... 3630956

[51] Int. Cl.$^4$ .................... G03C 1/70; G03C 5/16; G03F 7/26
[52] U.S. Cl. ..................................... 430/18; 430/280; 430/284; 430/287; 430/325; 430/330; 430/296; 430/945; 522/97; 522/96
[58] Field of Search ................. 430/18, 280, 284, 287, 430/325, 330, 296, 945; 522/97, 96

[56] References Cited

U.S. PATENT DOCUMENTS

| | | | |
|---|---|---|---|
| 2,791,504 | 5/1957 | Plambeck | 430/325 X |
| 3,776,889 | 12/1973 | Pande et al. | 522/97 X |
| 3,957,512 | 5/1976 | Kleeburg et al. | 96/35.1 |
| 4,055,606 | 10/1977 | Prevorsek et al. | 428/416 X |
| 4,292,398 | 9/1981 | Rubner et al. | 430/306 |
| 4,311,785 | 1/1982 | Ahne et al. | 430/283 |
| 4,481,258 | 11/1984 | Sattler et al. | 428/371 |

OTHER PUBLICATIONS

W. S. DeForest, *Photoresist: Materials and Processes* Chapter Four, "Negative Resists", McGraw-Hill Book Company, New York, N.Y., 1975, pp. 89–131.
R. Darms, "Angewandte Chemie/Chemie-Ingenieurwesen"Chimia 38, no. 1 (1984).

*Primary Examiner*—Paul R. Michl
*Assistant Examiner*—Cynthia Hamilton
*Attorney, Agent, or Firm*—Kenyon & Kenyon

[57] ABSTRACT

A method of manufacturing heat-stable structured layers by applying a radiation-sensitive soluble photopolymer in the form of a layer or film on a substrate, irradiating the layer or film through a negative pattern with actinic light or through the use of a light, electron, laser, or ion beam, removing the non-irradiated layer or film parts and, optionally tempering the remaining parts is described wherein the photopolymer comprises an addition reaction product of an olefinically unsaturated monoisocyanate and a hydroxyl group-containing epoxy compound. The invention provides a cost-effective method of manufacturing dimension-precise structured layers of high quality in a single coating process. The layers produced with this method even resist high thermal and mechanical stresses in immersion soldering processes, and protect circuit surfaces effectively and permanently against moisture and corrosion. They are suitable for use, in particular, as solder resist and insulating layers in microelectronics.

18 Claims, No Drawings

METHOD FOR MANUFACTURING HEAT-STABLE STRUCTURED LAYERS BASED ON EXPOXY RESIN

This application is a continuation of application Ser. No. 092,473, filed 09/03/87 now abandoned.

FIELD OF THE INVENTION

The invention relates to a method for manufacturing heat-stable structured layers based on epoxy resin by applying radiation-sensitive soluble polymers in the form of a layer or film on a substrate, irradiating the layer or film through negative patterns with actinic light or by using a light, electron, laser or ion beam, removing the non-irradiated layer or film parts and optionally tempering the remaining irradiated layer or film parts, as well as to the use of these structured layers.

BACKGROUND OF THE INVENTION

Methods for manufacturing structured layers based on heat-stable polymers are known, for example from the German Patent document 2 308 830 as well as the European Patent documents 0 019 123 and 0 026 820. In these methods, soluble photoreactive intermediary stages of highly heat-stable polymers are used for photolithographic structuring, and the structures produced from them cyclized in a subsequent tempering step. For the complete cyclization and removal of the cleavage products temperatures of up to 400° C. are required. This requires substrates capable of withstanding high thermal loads.

In the fields of circuits and conductors, e.g., in circuitboard technology, substrates based on epoxides are used, which can be thermally stressed up to maximally approximately 150° C. per hour, and which need to be able to tolerate temperatures of approximately 280° C. only for seconds, for instance during soldering processes. The solder resist lacquers used here to partially cover conducting paths must meet similar thermal demands; in order to cover the sites of the circuit surface which are not in contact with the soldering metal, polymers of medium thermal stability are required. The dry resists used until now for this purpose, e.g., silk screening lacquers, based on epoxides and acrylates, meet the requirements of the function of a solder resist mask. However, these resists only partially fulfill the increased demands relating to measuring accuracy (pattern outline accuracy) in microelectronics technology with structures of less than 100 microns, as well as the requisite cycling strength. To this end, photolithographic lacquer systems are required.

A photostructurable lacquer system based on epoxides with chalcon groups built into the polymer chains, i.e. groups having the structure $—C_6H_4—CH=CH—CO—C_6H_4—$, is already available, which would ensure sufficient measuring accuracy (see "Chimia", Vol. 38 (1984), pages 13 to 20). With respect to the photostructurability, however, relatively long exposure times, and particularly long developing times are involved. Beyond that, with the known lacquer systems, additional permanent protection of the circuit surface (which is often sensitive to damaging gases) can only be achieved through elaborate multiple coating processes. Furthermore, the overall process, is long and cost-intensive, due to the lengthy after-curing times, which sometimes last for several hours.

Accordingly, an object of the invention is to develop a method for manufacturing precisely dimensioned, high-quality, heat-stable structured layers, in particular on circuit surfaces, in a single coating process, which also resist the extensive thermal and mechanical stresses, for example, during immersion soldering processes, and, which moreover, protect the circuit surfaces effectively and permanently against moisture and corrosion. In particular, the overall process is intended to be shortened by allowing shorter exposure, developing and tempering times and thus become more cost-effective.

SUMMARY OF THE INVENTION

These and other objects are achieved according to the invention, by manufacturing the structured layers from radiation-sensitive photopolymers which comprise the addition reaction products of olefinic unsaturated monoisocyanates and hydroxyl group-containing epoxides.

The method according to the invention permits, within the framework of a cost-efficient process, the production of microstructured protective and insulating layers for use in the fields of semiconductors and circuits, which permanently and effectively protect the structures and circuits subject to corrosion. A particular advantage is that the developing process does not lead to under-resolution, and thus no solder bridges appear during soldering processes. The method according to the invention fulfills, furthermore, the stated requirements with respect to measuring accuracy of the generated structures, and allows very high resolution within a broad layer thickness range with short developing times. Moreover, this method is particularly cost-effective because it yields, with one single application (with conventional equipment), if necessary after brief tempering, photostructured layers of sufficiently high heat-stability, which remain dimensionally stable and tear-free and effective as permanent protection against moisture and corrosion, even under conditions of immersion soldering. The good electrical characteristics are not impaired even in humid climates. The structured insulating layers prepared according to the invention are thus suitable in particular as solder resists and as permanent protection on circuit board substrates with copper or copper oxide conducting path surfaces (track surfaces).

DETAILED DESCRIPTION OF THE INVENTION

In the method according to the invention the photopolymers can be advantageously used together with light- or radiation-sensitive copolymerizable compounds. To this end, acrylate and methacrylate group-containing compounds are preferentially used, in particular trimethylopropane triacrylate and -methacrylate and/or 1,4-butane-dioldimethacrylate. Alternatively, allyl group-containing compounds, for instance diallyl- and triallyl cyanurates, as well as N-substituted maleimides can be used. Further, photoinitiators and/or sensitizers can be used (See, "Industrie Chimique Belge", Vol. 24, 1959, pages 739 to 764, as well as J. Kosar, "Light-Sensitive Systems", John Wiley & Sons Inc., N.Y. 1965, pages 143 to 146 and 160 to 188). Especially suitable are alpha-halogenacetophenones; dialkoxyacetophenones such as dimethoxy- and diethoxyacetophenone, benzoylphosphine oxides which likewise can be substituted, and Michler's ketone. As photoinitiators or sensitizers, for example benzoic ether; 4,4′-bis(diethylamino)-benzophenone; 2,6-bis(p-azidobenzylidene)-4-methylcyclohexanone; thioxanthones such as isopropyl thioxanthone; and acetophenone are suitable. Furthermore, in the method according to the invention, adhesion promoting agents can be used to advantage. For this, in particular, silanes can be employed, such as vinyltriethoxysilane, vinyl-tris(beta-methoxyethoxy)silane, gamma-methacryloxypropyl-trimethoxysilane, gamma-glycidoxypropyltrimethoxysilane, and gamma-aminopropyl-triethoxysilane.

Furthermore, to the solutions of the photopolymers curing agents comparable to those conventionally used for curing epoxy resins are preferentially added. Furthermore, mineral filler substances can also be advantageously added, in particular those based on silicon dioxide and aluminum oxide, as well as other, conventionally used filler substances.

The photopolymers used in the method according to the invention are described in the concurrently filed U.S. patent application Ser. No. 092,472, entitled "Photopolymers based on epoxy resin", which is based on German patent application No. P 36 30 960.5, filed Sept. 11, 1986, the disclosure of which is incorporated by reference herein. These photopolymers in general have the following structure:

group, optionally containing hetero atoms, and/or having a heterocyclic structure;

$R^1$ is a divalent aliphatic group;

$R^2$ is an optionally halogen substituted, divalent aliphatic and/or cycloaliphatic group;

$R^3$ is hydrogen or an optionally halogen substituted alkyl group;

$R^4$ is an olefinic unsaturated group, for example an allylether- or maleimide-containing group and, in particular, an optionally substituted (meth)acrylic ester-containing group, bound by an aliphatic and/or cycloaliphatic and/or aromatic bridge.

The starting materials of the photopolymers are preferentially epoxy resins with partial aromatic structures. The partial aromatic structures can be advantageously halogenated, in particular brominated. The epoxides themselves have preferentially an epoxide equivalency weight between 600 and 6000, in particular between 2400 and 4000.

Preferentially used photopolymers are addition reaction products of isocyanatoethyl methacrylate and epoxy resins having partial aromatic structures, which contain optionally fluorinated isopropyl groups, or addition reaction products of optionally nucleus-brominated, partial aromatic structures containing epoxide resins and olefinic unsaturated monoisocyanates

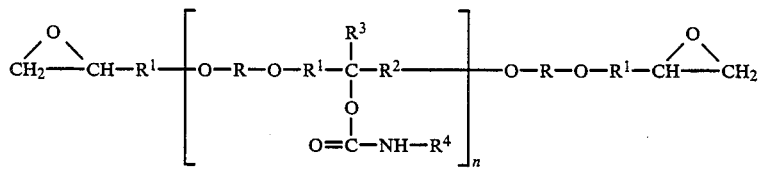

where $n \neq$ is an integer between 1 and 20.
For
R, $R^1$, $R^2$, $R^3$, and $R^4$ the following applies:
R is an optionally halogenated, divalent i.e. bifunctional aromatic and/or aliphatic and/or cycloaliphatic in the form of addition reaction products of 2,4-diisocyanatotoluene and hydroxyethyl acrylate or -methacrylate. Such photopolymers are explained in greater detail in formula (1) and (2).

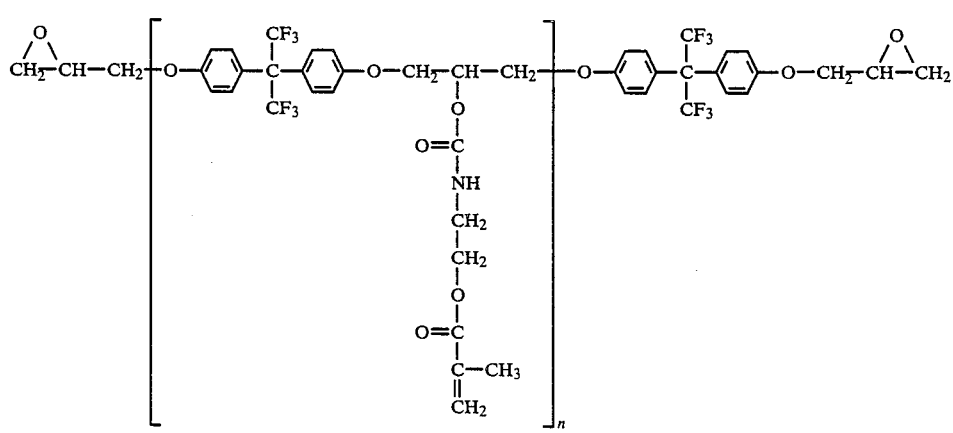

(1)

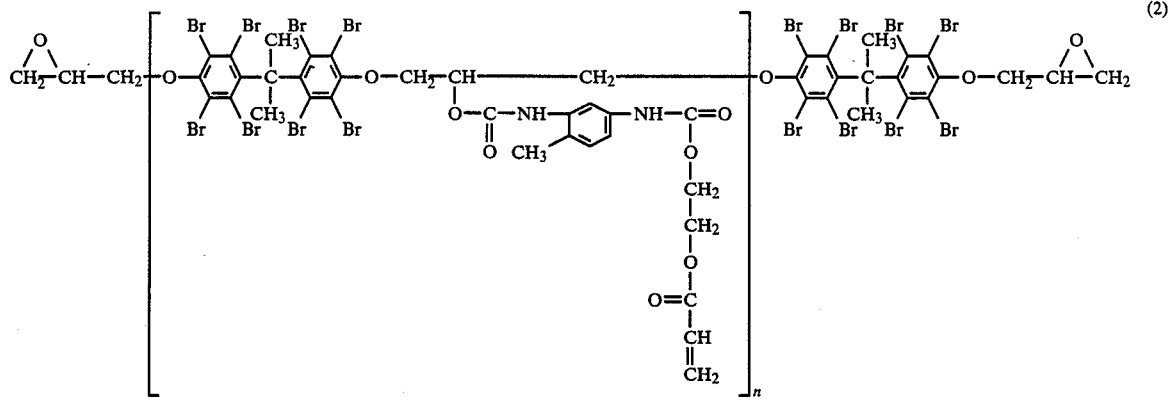

Production of the structured layers according to the invention, as already mentioned, takes place in such manner that the photopolymers in the form of a layer or film are applied on a substrate and exposed to actinic light through a mask, or by using a light, electron, laser, or ion beam. Subsequently, the non-exposed, i.e. non-irradiated layer or film portions are removed or peeled off, and the thusly obtained structured layers or relief structures, are optionally tempered as required. The photopolymer is preferably applied to the substrate dissolved in an organic solvent. The concentration of the photopolymer in common solvents like cyclohexanone, gamma-butyrolactone, N-methylpyrrolidone and mixtures of these can be selected in such a way that with known coating procedures, like centrifuging, immersion, spraying, casting, silk screening, brushing, or rolling, layer thicknesses of 0.01 to approximately 500 microns can be generated. To achieve a uniform and good surface quality on substrates with smooth surfaces, casting (a method of this nature is known, for example from the European Patent document 0 002 040), silk screening, and, in particular, electrostatic spray coating and coating by centrifugation at 300 to 10,000 rpm can be utilized with advantage. In the case of non-uniform surfaces, like circuit boards with copper conducting paths on the surface, rpms of 300 to 1500 are advantageous. The range of viscosity of the solutions used for silk screening, spraying and casting preferably lies between 200 and 1500 mPa.s at 23° C.

The photolacquer layer applied on the substrate, which preferentially consists of circuit board material, glass, metal, synthetics or semiconductors, can at room temperature, but preferentially at temperatures of 50° to 80° C., be freed of the solvent in a nitrogen or air stream; it is also possible to work in a vacuum, with infrared radiators, or on a heated plate.

In the method according to the invention, to achieve a sufficient solubility differential between the irradiated and the non-irradiated layer or film parts, with the use of a 350 W high-pressure mercury vapour lamp, exposure times between 5 and 400 seconds as a function of the composition and the layer thickness suffice. After the exposure, and if necessary after an after-drying process, the non-exposed parts are dissolved out with organic solvents.

The structured layers or relief structures prepared with the method according to the invention are remarkable for their edge sharpness, high resolution, tear-free homogeneous surfaces. The structured layers have high thermal stabilities and can resist the high thermal and mechanical loads of an immersion soldering process. Adhesion to the soldering material is very slight, so that, as desired, no soldering pearls adhere to the polymer layer. The structured layers prepared according to the invention are sufficiently elastic to tolerate cycle tests between −65° and +125° C. without tearing. Circuit surfaces covered with the structured layers show in climate tests at 40° C. and 92% ambient humidity, at a voltage of 100 v, no conducting path corrosion. Such layers are thus suitable, in addition to employment as solder resist masks, as effective and permanent protective layers against the effects of moisture and harmful gases.

The structured layers according to the invention are suitable due to their high degree of purity (because of their manner of preparation) also as materials for passivation layers on semiconductor structural elements, of thin and thick film circuits, of solder resist layers on multiple layer circuits, of insulating layers as component of layer circuits, and of miniaturized protective and insulating layers of electrically conductive and/or semiconductor and/or base materials, and in general for microstructuring of substrates and for structure transfer processes, like wet and dry etching processes, currentless or galvanic metal deposition and vapour deposition processes, as well as for masks for ion implantation. Beyond that, these layers are suitable for use as insulating and protective layers in the electrical and microelectronic technology, as well as as damping substance for surface wave filters, in particular television medium frequency filters, further as orientation layers in liquid crystal displays as well as as dielectric material in multiple layer circuits.

The invention is explained in greater detail below in conjunction with embodiments.

EXAMPLE 1

To 69 parts by weight of dried dichloromethane under dry conditions, 40 parts by weight of pure 2,4-diisocyanatotoluene are added. To the thusly obtained solution, 29.2 parts by weight of 2-hydroxyethyl acrylate are slowly added dropwise under agitation at room temperature. After resting for 24 hours, the isocyanate group conversion is determined by titration to be 99%. The photoreactive isocyanate is extracted with 250 parts by weight of light petrol, and after the extraction agent is removed, isolated as a clear viscous fluid. A yield of 64.5 g, i.e. 93% of the theoretical yield, is obtained.

To a solution of 100 parts by weight of a nucleus-brominated epoxy resin based on bisphenol A (see formula (2); n=10) in 200 parts by weight of, cyclohexanone 366 parts by weight of gamma-butyrolactone, 353 parts by weight of N-methylpyrrolidone, 131 parts by weight of the pure photoreactive monoisocyanate isolated in the above described manner, and 0.3 parts by weight of dibutyl tin dilaurate are added at room temperature and with agitation. After the mixture has been agitated for 48 hours, 18 parts by weight of ethanol are added to the reaction solution. After another 24 hours, no isocyanate groups are shown to be present.

To 100 parts by weight of the photoreactive epoxide resin prepared in the above described manner, as a 23% resin solution, 0.65 parts by weight of benzoin isopropyl ether, 0.22 parts by weight of Michler's ketone, 1.65 parts by weight of trimethylolpropane triacrylate, 0.3 parts by weight of vinyl-tris(beta-methoxyethoxy)-silane and 0.2 parts by weight of 2-isopropylimidazole (as curing agent) are added. The solution is pressure-filtered through a 5 micron filter. The viscosity of the thusly obtained solution is approximately 300 mPa.s at 23° C.

By centrifuging the solution at approximately 500 rpm onto a silicon wafer coated with an adhesion promoting agent and a subsequent drying for 30 minutes at 70° C. in a circulating air furnace, 23 micron thick homogeneous layers are obtained, which after exposure of 40 seconds with a 350 W high-pressure mercury vapour lamp through a mask are developed with gamma-butyrolactone xylene (volumetric ratio 1:2) and rinsed with xylene in a spraying process to yield sharply-contoured structured layers. The edge formation and the surface quality of these layers are not impaired through tempering at 150° C. for one hour. The resolved structures lie at ≦20 microns.

A photostructured layer treated with known commercial flux agents has, after the immersion soldering test at 260° C. and 20 seconds immersion time, a homogeneous tear-free surface. The soldering material rolls off the lacquer surface easily.

EXAMPLE 2

To a solution of 100 parts by weight of the epoxy resin Araldit GT 6099 (Araldit® is a trade mark of Ciba-Geigy AG) in 110 parts by weight of cyclohexanone, 55 parts by weight of pure isocyanatoethyl methacrylate and 0.15 parts by weight of dibutyltin dilaurate are added and the mixture is agitated for 24 hours. Subsequently, 17 parts by weight of ethanol are added to the reaction solution. After another 24 hours, to 100 parts by weight of the resin solution are added 0.55 parts by weight of dichloroacetophenone, 1.65 parts by weight of diethoxyacetophenone, 0.55 parts by weight of Michler's ketone, 0.55 parts by weight of vinyl-tris(-beta-methoxyethoxy)silane, and 0.1 parts by weight of 2-isopropylimidazole (as curing agent). Subsequently, the solution is pressure-filtered through a 5 micron filter.

The filtered solution of the photoreactive epoxy resin is centrifuged at 400 rpm onto a circuit board test plate with copper conducting paths on the surface and subsequently dried for ½ hour at 70° C. in a circulating air furnace. The thickness of the lacquer layer is 50 microns. After exposure with a 350 W high-pressure mercury vapour lamp through a mask for 10 seconds, and after a drying period of 2 minutes at 90° C. in the circulating air furnace, with cyclohexanone as the developer and water as stopper, a sharp-edged structured layer is obtained after 35 seconds. After curing for 30 minutes at 150° C., the surface quality of the layer is not impaired even after 100 times of cycling between −65° and +125° C. These layers also resist unimpaired wave and immersion soldering processes at 260° C.; the solder material rolls off the surface. Moisture tests at 40° C. and 92% ambient moisture and at 100 V voltage do not show any evidence of corrosion of the conducting paths covered with the lacquer.

EXAMPLE 3

To 113 parts by weight of dried dichloromethane under dry conditions, 62 parts by weight of 2,4-diisocyanatotoluene are added. Thereafter, at room temperature and while agitating 51.2 parts by weight of 2-hydroxyethylmethacrylate are slowly added dropwise. After a reaction time of 24 hours at room temperature, the isocyanate conversion is determined to be 99% by titration. By adding 450 parts by weight of light petrol, a precipitate of white crystals is obtained. The yield of pure photoreactive monoisocyanate is 105 parts by weight or 93% of the theoretical yield.

To a solution of 87 parts by weight of the photoreactive monoisocyanate prepared in the above-described way, in a mixture of 170 parts by weight of gamma-butyrolactone, 138 parts by weight of N-methylpyrrolidone and 0.015 parts by weight of dibutyltin dilaurate, 63 parts by weight of the epoxy resin Araldit GT 6099 are added under dry conditions and allowed to react while agitating for 12 hours at 50° C. Subsequently, at this temperature, 8 parts by weight of 2-hydroxyethyl methacrylate are added to the reaction solution. After another 5 hours, 4 parts by weight of ethanol are added. After 24 hours the resin solution has a viscosity of approximately 200 mPa.s at 23° C.

To 100 parts by weight of the above described solution 1.2 parts by weight of isopropyl thioxanthone, 0.4 parts by weight of Michler's ketone, 2.0 parts by weight of trimethylolpropane triacrylate and 0.4 parts by weight of vinyltriethoxysilane are added. After pressure-filtration through a 5 micron filter at 5 bar, by casting on substrates, 20 micron thick lacquer layers are produced and irradiated with a 350 W high-pressure mercury vapour lamp for 30 seconds through a mask. Subsequently, the exposed layer is after-dried for 5 minutes at 90° C. in the circulating air furnace. Structuring takes place in 10 seconds with a developer mixture of gamma-butyrolactone and xylene (volume ratio 1:2) with xylene as stopper. The thusly produced structured layer is resistant to immersion soldering.

EXAMPLE 4

To a solution of 66.8 parts by weight of pure 2,4-diisocyanatotoluene in 115 parts by weight of dichloromethane, at room temperature, while agitating and under dry conditions, a mixture of 23.6 parts by weight of pure 2-hydroxyethyl acrylate and 24.8 parts by weight of pure 2-hydroxyethyl methacrylate is slowly added dropwise. After a 30 hours reaction time at room temperature, the isocyanate conversion is determined by titration to be 98%.

The obtained solution of the photoreactive monoisocyanate is combined with a solution of 98 parts by weight of the epoxy resin Araldit GT 6099 in 397 parts by weight of gamma-butyrolactone and with 0.22 parts by weight of dibutyltin dilaurate. After 24 hours reaction time at room temperature, 15 parts by weight of ethanol are added to the reaction solution. After another 24 hours the solution is ready to be used for coating.

To 100 parts by weight of the solution of the photoreactive epoxy resin prepared in the desired way 1.2 parts by weight of 2,4,6-trimethyl-benzoylphosphine oxide, 0.3 parts by weight of Michler's ketone, 0.3 parts by weight of vinyltriethoxysilane and 30 parts by weight of talcum (as filler substance) are added. By casting on copper substrates, 30 micron thick lacquer layers are produced and irradiated with a 350 W high-pressure mercury vapour lamp for 30 seconds through a mask. After developing with the developer used in Example 2 for 35 seconds, structures with smooth tear-free surfaces are obtained, which are stable even under immersion soldering conditions at 260° C. The soldering material does not adhere to the lacquer surface but rolls off.

This invention has been described in terms of specific embodiments set forth in detail, but it should be understood that these are by way of illustration only, and that the invention is not necessarily limited thereto. Modifications and variations will be apparent from this disclosure and may be resorted to without depart from the spirit of this invention, as those stated in the art will readily understand. Accordingly, such variations and modifications are considered to be within the scope of this invention and the following claims.

We claim:

1. A method for manufacturing heat-stable structured layers based on epoxy resin, which comprises the steps of applying a radiation-sensitive soluble photopolymer in the form of a layer or film on a substrate, irradiating the layer or film through a negative pattern with actinic light or by using a light, electron, laser, or ion beam, and removing the non-irradiated layer or film portions, wherein the photopolymer comprises an addition reaction product of an olefinic unsaturated monoisocyanate, selected from the group consisting of an isocyanate having at least one methacrylate group, and the addition reaction product of hydroxyethyl acrylate or methacrylate and 2,4-diisocyanatotoluene, and a hydroxyl group-containing epoxy compound.

2. The method according to claim 1, further comprising the step of tempering.

3. The method according to claim 1, wherein the photopolymer is employed together with a light- or radiation-sensitive copolymerizable compound.

4. The method according to claim 3, wherein the copolymerizable compound contains an acrylate or methacrylate group.

5. The method according to claim 1 wherein the photopolymer is employed together with photoinitiator or a photosensitizer or a mixture thereof.

6. The method according to claim 5, wherein the photoinitiator or photosensitizer is selected from the group consisiting of alpha-halogenacetophenones, dialkoxyacetophenones, benzoylphosphine oxides, and Michler's ketone.

7. The method according to claim 1, wherein the epoxy compound in part contains aromatic groups.

8. The method according to claim 7, wherein the epoxy compound has an epoxide equivalency weight of 600 to 6000.

9. The method according to claim 1, wherein the photopolymer is employed together with an epoxide curing agent.

10. The method according to claim 1, wherein the photopolymer is employed together with a mineral filler material.

11. A heat-stable structured layer, produced according to claim 1.

12. A durable, protective solder resist and insulating layer for use in microelectronics technology, which comprises a structured layer produced according to claim 1.

13. A resist with intermediate protective function for use in structure transfer processes by electroplating, wet and dry etching, and ion implantation, which comprises a structured layer produced according to claim 1.

14. A protective and insulating material for use in electrical engineering, including semiconductor technology, which comprises a structured layer produced according to claim 1.

15. A damping substance for surface wave filters, which comprises a structured layer produced according to claim 1.

16. An alpha-ray protector for the cell fields of a memory component, which comprises a structured layer produced according to claim 1.

17. An orientation layer for liquid crystal displays, which comprises a structured layer produced according to claim 1.

18. A dielectric material for use in multiple layer circuits, which comprises a structured layer produced according to claim 1.

* * * * *